United States Patent [19]

Otsuji et al.

[11] Patent Number: 5,321,632
[45] Date of Patent: Jun. 14, 1994

[54] METHOD AND APPARATUS FOR MEASURING THE LENGTH OF A TRANSMISSION LINE IN ACCORDANCE WITH A REFLECTED WAVEFORM

[75] Inventors: Taiichi Otsuji; Toshiyuki Shimizu, both of Sagamihara, Japan

[73] Assignees: Nippon Telegraph and Telephone Corporation, Tokyo, Japan; Schlumberger Technologies, Inc., San Jose, Calif.

[21] Appl. No.: 840,118

[22] Filed: Feb. 24, 1992

[30] Foreign Application Priority Data

Feb. 26, 1991 [JP] Japan .................. 3-030946
Feb. 26, 1991 [JP] Japan .................. 3-030947

[51] Int. Cl.$^5$ ........................ G01R 31/11; G01B 7/02
[52] U.S. Cl. .................... 364/562; 364/561; 364/576; 324/617; 324/533
[58] Field of Search ............... 364/562, 576, 560, 561, 364/481, 483; 324/532, 533, 522, 534, 615, 617; 371/20.5

[56] References Cited

U.S. PATENT DOCUMENTS

| | | | |
|---|---|---|---|
| 4,568,872 | 2/1986 | Heller et al. | 324/522 |
| 4,739,276 | 4/1988 | Graube | 324/534 |
| 4,887,041 | 12/1989 | Mashikian et al. | 324/533 |
| 5,159,275 | 10/1992 | Fujimura | 324/617 |
| 5,162,743 | 11/1992 | Kruchowski et al. | 324/617 |

FOREIGN PATENT DOCUMENTS

| | | |
|---|---|---|
| 0229505 | 7/1987 | European Pat. Off. |
| 0391312 | 10/1990 | European Pat. Off. |
| 0471119 | 2/1992 | European Pat. Off. |
| 176560 | 10/1983 | Japan |
| 63-233382 | 9/1988 | Japan |
| 233382 | 9/1988 | Japan |
| 150877 | 6/1989 | Japan |
| 1150877 | 6/1989 | Japan |
| 2234521 | 9/1990 | Japan |
| 8809510 | 12/1988 | World Int. Prop. O. |

OTHER PUBLICATIONS

"A Picosecond Accuracy Timing Error Compensation Technique in TDR Measurement" Otsuji, Verisys Inc. International Test Conference 1991, IEEE, Oct. 26-30, 1991 pp. 969-975.

"Continual Autocalibration for High Timing Accuracy" Skala, Teradyne, Inc., IEEE Test Conference, 1980, pp. 111-116.

Hewlett-Packard Journal, vol. 40, No. 6, Dec. 1989, pp. 58-67, "Transmission Line Effects In Testing High-Speed Devices with a High-Performance Test System", by Rainer Plitschka.

1990 IEEE MTT-S International Microwave Symposium Digest vol. 3, May, 1990, pp. 1045-1048, "New Time Domain Reflectometry Techniques Suitable For Testing Microwave And Millimeter Wave Circuits", Shen et al.

IEEE Transactions On Instrumentation And Measurement, vol. 32, No. 1, Mar. 1983, pp. 134-136, "Wide-Band Device Modeling Using Time-Domain Reflectometry", Salvage et al.

IEEE Transactions On Nuclear Science, vol. 37, No. 2, Apr. 1990, "Ultra-Fast Voltage Comparators For Transient Waveform Analysis", B. T. Turko et al., pp. 424-429.

Primary Examiner—Jack B. Harvey
Assistant Examiner—Melanie A. Kemper
Attorney, Agent, or Firm—Spencer, Frank & Schneider

[57] ABSTRACT

By measuring the waveform of the reflected wave obtained by transmitting a pulse to an open-ended transmission line, a transfer function of the transmission line with respect to the incident wave is computed as a result of the measurement. Then, the waveform of the output wave at the output end or the open end of the transmission line is estimated in response to an individual input signal by using the transfer function computed. The transmission delay time of the transmission line is obtained by computing the time difference between the transient timing of the estimated waveform of the output wave and the transient timing of the waveform of the input signal.

6 Claims, 6 Drawing Sheets

METHOD AND APPARATUS FOR MEASURING THE LENGTH OF A TRANSMISSION LINE IN ACCORDANCE WITH A REFLECTED WAVEFORM

BACKGROUND OF THE INVENTION

1. Field of the Invention

The present invention relates to transmission line length measurement method and apparatus for measuring the length of an open-ended transmission line in accordance with a reflected waveform obtained by suppling a pulse to the transmission line, and especially relates to transmission line length measurements and apparatus suitable for high precision measurements of the length of a transmission line from circuits connected to these test terminals or pins for outputting test patterns and for judging test results to input/output terminals of tested circuits in an integrated circuit test apparatus having a plurality of test terminals or pins.

2. Description of the Prior Art

The length of each of the transmission lines from circuits connected to these test pins for outputting test patterns and for judging test results to input/output terminals of circuits under test varies from one line to another or among the test pins.

In a timing calibration, which is required for maintaining test timing accuracy in an integrated circuit test apparatus, it is one of the major procedures to calibrate the timing error caused by a deviation of the transmission line length between the test pins and input/output pins of the circuit under test.

One conventional method for measuring the length of a transmission line is disclosed in Japanese Laid-open Patent Application No. 176560/1983. In this prior art, as shown in FIG. 1, the time difference between a leading edge formed by the incident wave end a leading edge formed by the reflected wave of a stepwise wave obtained by superposing the incident wave with the reflected wave when the far end of the transmission line is opened is measured. This time difference corresponds to the transmission delay time when a signal is transmitted through the transmission line back and forth, and therefore, it is assumed that a half of this time difference corresponds to the net length of the transmission line.

One of the major factors determining the transmission delay time of a transmission line is a transmission velocity component determined by distributed capacitance and distributed inductance of the transmission line. If the transmission line exhibits no loss and no distortion in propagating waveforms over the frequency range of the input signal, the input signal can propagate through the transmission line without distortion of its waveform. In this case, the net propagation delay time coincides with one half of the time difference between a leading edge formed by the incident wave and a leading edge formed by the reflected wave of a stepwise wave obtained by superposing the reflected wave with the incident wave when the far end of the transmission line is opened.

However, an actual transmission line in a practical use, for example, such as coaxial cables and micro strip lines, contains loss components and a limited frequency band as well as group delay distortion, which are dependent on the materials and structures of the transmission line. Furthermore, in an actual setup of connections between the integrated circuit test apparatus and devices under test, the input terminals and the packages of the devices under test have capacitance components, so that the high frequency component of signals may be attenuated due to the time constant component determined by that capacitance and the characteristic impedance of the transmission line. These actual conditions affect the signal waveform from the output terminal of the transmission line and accordingly the signal waveform is distorted in response to the input waveform.

In the actual transmission line described above and usually used, the attenuation of the high frequency component of the signals is a significantly dominant factor, and if the pass frequency band of the transmission line is narrower than the frequency band of the input signal, the transient change in rise and fall behaviors of the output signals is less steep. Ordinarily, the transmission delay time of the transmission line is defined by measuring the time difference between the input signal and the output signal at their center value of the signal amplitude and hence, in distorted waveforms of the output signals, the extended time in the rise and/or fall behavior is substantially included in this time difference to be measured. The rise time and/or fall time increases as the length of the transmission line is extended but the relationship between the time and the length is not proportional. Assuming that the loss of high frequency components in a wave is mostly caused by the skin effect, the increase of the rise time and/or the fall time can be represented by an error function of the length of the transmission line. Assuming that the loss of high frequency components is mostly caused by the capacitance and the characteristic impedance of the transmission line, the increase of the rise time and/or the fall time can be represented by an exponential function of the time constant defined by the capacitance and the characteristic impedance of the transmission line. Accordingly, if the length of the transmission line including such a loss from the reflected waveform is measured as one-half of the time difference between the incident wave and the reflected wave mentioned above, the measured length of the transmission line contains an error from the proportional relationship of the increase of the delay time with the transmission line length.

For example, when a signal having a 100 ps leading time propagates by 1 m through a coaxial cable having a 10 dB/10 m loss at 1 GHz, the simple estimation of the transmission delay time is a few ps greater than the exact transmission delay time. If the same signal is mentioned above propagates by 30 cm through a micro strip line having a 3 dB or more loss at 3 GHz or less, the error between the simple estimation end the exact delay time is greater than 10 pico seconds. The longer the rise time of the input signal, the fewer the high frequency component in the input signal, so that the error between the simple estimation and the exact delay time is likely to be reduced. However, in semiconductor devices provided to operate at several hundreds MHz, their rise time is as small as 100 pico seconds, and in the conventional form of connections between the integrated circuit test apparatus and devices under test, it may be a frequent occurrence that a transmission line having worse transmission performance than that described above is used. In order to precisely test semiconductor devices with operating frequencies at several hundreds MHz, it is required that the time difference among a plurality of test signals supplied to devices under test and the time difference among judging circuits for judging a plurality of output signals from the devices under test are calibrated on the order of pico seconds. In the above mentioned prior art, however, Such a precise measurement of the transmission line length cannot be realized.

Conventionally, in measuring the transmission line length, such an apparatus as disclosed in Japanese Laid-open Application No. 150877/1989 is used. An example of prior art apparatus will be described with reference to FIG. 2.

In FIG. 2, two phase difference detecting circuits 101 end 102 are used. Input terminals A1 and B1 of the phase difference detecting circuits 101 end 102 are commonly connected to one end of a transmission line 100 to be tested with its far end open. A pulse signal S1 having a constant repetition period is supplied to the input terminals A1 and B1, and a reference pulse signal S2 having a constant repetition period which is slightly different from that of the pulse signal S1 is supplied to the input terminals A2 and B2. In the phase difference detecting circuit 101, the phase difference between the input signal at the terminal A1 end the input signal at the terminal A2 is compared at the timing of the first leading edge of the stepwise reflected wave at the input terminal A1. In the other phase difference detecting circuit 102, the phase difference between the input signal at the terminal B1 and the input signal supplied to the terminal B2 is compared at the timing of the second leading edge of the stepwise reflected wave at the input terminal B1.

In FIG. 2, the phase difference information signals S3 end S4 from the phase difference detecting circuits 101 and 102 are supplied to an EOR(Exclusive OR) gate 103, and its gate output S5 and the reference pulse signal S2 are supplied to an AND gate 104. The AND logic gate 104 outputs the reference pulse signal S2 as a valid pulse signal S6 only when the phase difference S3 and S4 do not coincide with each other. By counting the number of the valid pulse signals S6 by the counter 105, the time difference between the first leading edge and the second leading edge of the stepwise reflected wave is obtained, end one-half of the time difference thus obtained is used as the transmission delay time of the transmission line when a wave travels one way in the transmission line.

As a state where the phase difference information signals S3 and S4 from the phase difference detecting circuits 101 end 102 do not coincide with each other, there exist two states, i.e., one state where the leading edges of the phase difference information signals S3 and S4 do not coincide with each other and the other state where the trailing edges of the phase difference information signals S3 end S4 do not coincide with each other. For example, in case of detecting the phase difference at the leading edges of the input signals A1 and B1, the leading edges of the phase difference information signals S3 end S4 occur at the time that the leading edges of the input signals A1 and B1 cross the leading edge of the reference pulse signal S2. On the other hand, the trailing edges of the phase difference information signals S3 and S4 occur at the time that the leading edges of the input signals A1 end B1 cross the trailing edge of the reference pulse signal S2.

Both of the phase difference between the leading edges of the phase difference information signals S3 and S4 end the phase difference between the trailing edges of the phase difference information signals S3 and S4 are determined by the transmission delay time 2T when a wave travels back and forth along the transmission line, the repetition period t of the pulse signal S1, and the repetition period t+dt of the pulse signal S2. Each of the phase differences is equal to $2T(t+\Delta t)/\Delta t$ under an ideal condition.

However, the actual phase difference detecting circuit has its own inherent characteristics of detection sensitivity. The more its detection sensitivity is lowered, the more the detected phase difference contains errors.

Therefore, if there is a difference in the detection sensitivity characteristics of the phase difference detecting circuits 101 and 102 between detection between the leading edges and detection between the leading edge and the trailing edge, the detection result in the phase difference between edges with lower detection sensitivity characteristics contains a greater error. In the above mentioned conventional measurement method, this error is inevitably included in the measured value.

For example, when a circuit disclosed in Japanese Laid-open Application No. 233382/1988 is applied to the above-mentioned phase difference detecting circuit, the phase difference between the leading edges can be detected with the detection sensitivity of a few pico seconds according to current semiconductor technologies. In contrast, the detection sensitivity in the case of the phase difference detection between the leading edge and the trailing edge is low in principle, so that there is a problem in obtaining an accurate measurement.

In the above described conventional technologies, the number of reference pulse signals repeated during one period in which both of the phase difference information signals do not coincide with each other corresponds to an amount equal to twice the length of the transmission line. Accordingly, it is required that the number of reference pulse signals repeated be counted during one period in which both of the phase difference information signals do not coincide with each other, or to precisely determine how many periods in which both of the phase difference information signals do not coincide with each other corresponds to the counted number of reference pulse signals. However, there is no means for realizing such functions other then a supplemental means for controlling the number of input signal pulses to the phase difference detecting circuits.

SUMMARY OF THE INVENTION

It is an object of the present invention to solve the above mentioned problems in the prior art and to provide a method for measuring the length of the transmission line precisely.

It is another object of the present invention to solve the above mentioned problems in the prior art systems and to provide a highly precise apparatus for measuring the length of the transmission line without counting the number of input signal pulses.

In order to attain these objects, in the first aspect of the present invention, a transmission line length measurement method for measuring a length of an open end transmission line length from a reflected wave waveform obtained by transmitting a pulse to the open end transmission line, comprises the steps of:

measuring three elements including
  a time difference between a pulse edge formed by an incident wave component of the pulse and a pulse edge formed by a reflected wave component of the pulse,
  a waveform of the pulse edge formed by the incident wave component, and
  a waveform of the pulse edge formed by the reflected wave component;

computing a first transfer function of the transmission line when the pulse travels back and forth or in both directions through the transmission line as a result of the measurement of the three elements;

computing a second transfer function of the transmission line when the pulse travels through the transmission line in either direction in accordance with the first transfer function;

obtaining an individual output signal response with respect to an input signal from the second transfer function when the pulse travels through the transmission line in either direction; end computing a delay time of the output signal response with respect to the input signal in accordance with the output signal response thus obtained, whereby the transmission delay time of the transmission line with respect to the individual input signal is measured.

Here, the above mentioned first transfer function of the transmission line when the pulse travels back and forth through the transmission line may be obtained as a function of frequency by means of a Fourier transform and then by means of an inverse Fourier transform of a product of a frequency response of the input signal and the second transfer function of the transmission line when the pulse travels through the transmission line in either direction, and an output signal response with respect to an individual input signal can be calculated.

Furthermore, the transmission delay time can be separated into a true transmission delay time defined by an ideal condition where a frequency band is infinite and an additional transmission delay time due to an actual condition deviated from the ideal condition. A single path in either direction of the transmission line can be represented as a circuit characterized by defining the true transmission delay time to be a constant value and defining the additional transmission delay time to be a time constant component given by the product of the characteristic impedance and the capacitance component of the transmission line, end a two way or back and forth path in both directions of the transmission line can be represented by a series connection of two single paths, each directed in one direction of the transmission line. Then, the net transfer function of the transmission line can be approximated by a transfer function given by the above-mentioned circuit representation.

In the present invention, by measuring the waveform of the reflected wave obtained by transmitting a pulse to the open-ended transmission line, a transfer function of the transmission line with respect to the incident wave is computed as a result of the measurement. Then, the waveform of the output wave at the output end or the open end of the transmission line is estimated in response to an individual input signal by using the transfer function computed. The transmission delay time of the transmission line is obtained by computing the time difference between the transient timing of the estimated waveform of the output wave and the transient timing of the waveform of the input signal.

In the second aspect of the present invention, a transmission line length measurement apparatus for measuring a length of an open end transmission line length from a reflected waveform obtained by transmitting a pulse to the open end transmission line, comprises:

a first phase difference detecting circuit receiving, as input signals, a stepwise wave generated by an open end part of the transmission line and having a constant repetition period and a reference pulse signal having a repetition period being a little different from the repetition period of the stepwise wave, threshold values of the input signals being able to be controlled independently, and for detecting selectively a phase shift between both the input signals at every leading or trailing edge of the stepwise wave formed by an incident wave component obtained when the pulse travels forward;

a second phase difference detecting circuit receiving as input signals the stepwise wave and the reference use signal, threshold values of the input signals being able to be controlled independently, and for detecting selectively a phase difference between both the input signals at every leading or trailing edge of the stepwise wave formed by a reflected wave component obtained when the reflected pulse travels backward;

a third phase difference detecting circuit receiving as two common input signals the stepwise wave, threshold values of the input signals being able to be controlled independently, and for detecting selectively a phase shift between a leading edge of a reflected wave component of the stepwise wave and a leading edge of an incident wave component of the stepwise wave or a phase difference between a trailing edge of the reflected wave component of the stepwise wave and a trailing edge of the incident wave component of the stepwise wave;

a phase difference signal extraction circuit receiving a first phase difference information signal from the first phase difference detecting circuit, a second phase difference information signal from the second phase difference detecting circuit and a third phase difference information signal from the third phase difference detecting circuit, end for extracting selectively one of a phase shift period between a leading edge part of the first phase difference information signal and a leading edge part of the second phase difference information signal and a phase shift period between a trailing edge part of the first phase difference information signal and a trailing edge part of the second phase difference information signal;

a reference pulse gate circuit receiving a request signal, for enabling the reference pulse signal only during the phase difference period extracted by the phase shift signal extraction circuit and a period of time corresponding to one period of the first or the second phase difference information signal after the request signal is inputted; and a counter for counting an output signal from the reference pulse gate circuit.

In the present invention, the timing of the edge formed by the incident wave and the timing of the edge formed by the reflected wave, each edge being a part of a stepwise wave in which the reflected wave is superposed on the incident wave, are compared individually with the timing of the reference pulse having a repetition period slightly different from that of the stepwise wave. At the same time, the phase polarities of the edge formed by the incident wave end the edge formed by the reflected wave are detected. By using these comparison and detection results, among the non-coincidence states of the phase difference information signal obtained by timing comparison of the edge formed by the incident wave with the reference pulse and the phase difference information signal obtained by timing comparison of the edge formed by the reflected wave with the reference pulse, either one of the non-coincidence states between the leading edges of the above two phase difference information signals or between the trailing edges of the above phase difference information signals is selectively extracted, and the reference pulse signal is countered only during one signal period of the above non-coincidence extracted state after the measurement request signal is inputted from outside, so that the timing difference between the edge formed by the incident wave and the edge formed by the reflected wave, that is, the length of the transmission line is measured.

Therefore, even if the detection sensitivities of the phase difference detecting circuits are different between the detection between the edges having the same polarity and the detection between the edges having different polarities, only the detection result obtained from the detecting circuit having a higher sensitivity can be employed as the measurement result accordingly, the characteristics of the phase difference detecting circuits can be best used effectively and the length of the transmission line can be measured precisely. In addition, it is ensured that the number of pulses corresponding to the length of the transmission line can be obtained without controlling the number of pulses in the input signal.

The above and other objects, effects, features and advantages of the present invention will become more apparent from the following description of embodiments thereof taken in conjunction with the accompanying drawings.

BRIEF DESCRIPTION OF THE DRAWINGS

Embodiments of the invention will now be described by way of example and with reference to the accompanying drawings in which.

DETAILED DESCRIPTION OF PREFERRED EMBODIMENTS

Figure 3:
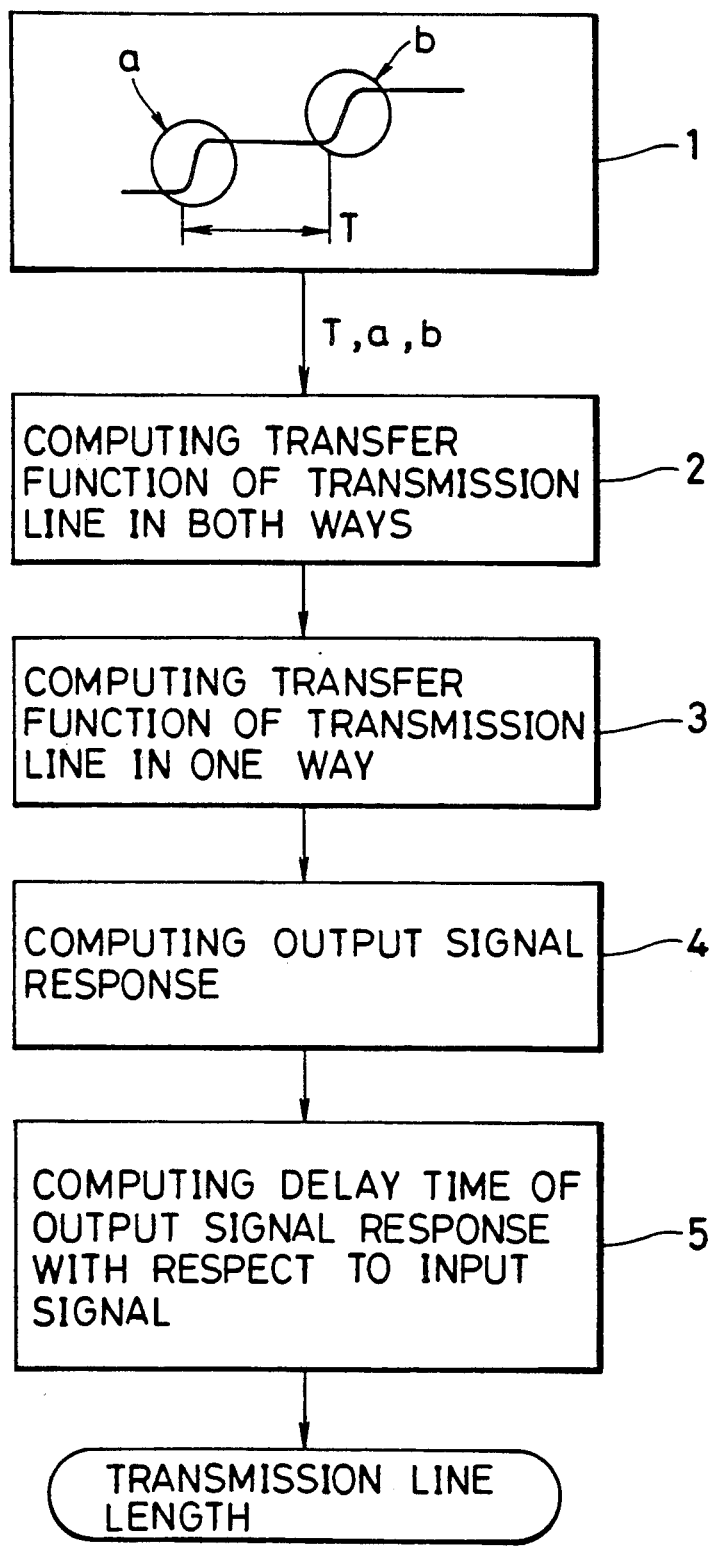
FIG. 3 is a flow chart showing one embodiment of a method of measuring the length of a transmission line in accordance with the present invention.

FIG. 3 is a flow chart showing one embodiment of a method of measuring the length of a transmission line in accordance with the present invention.

Figure 1:
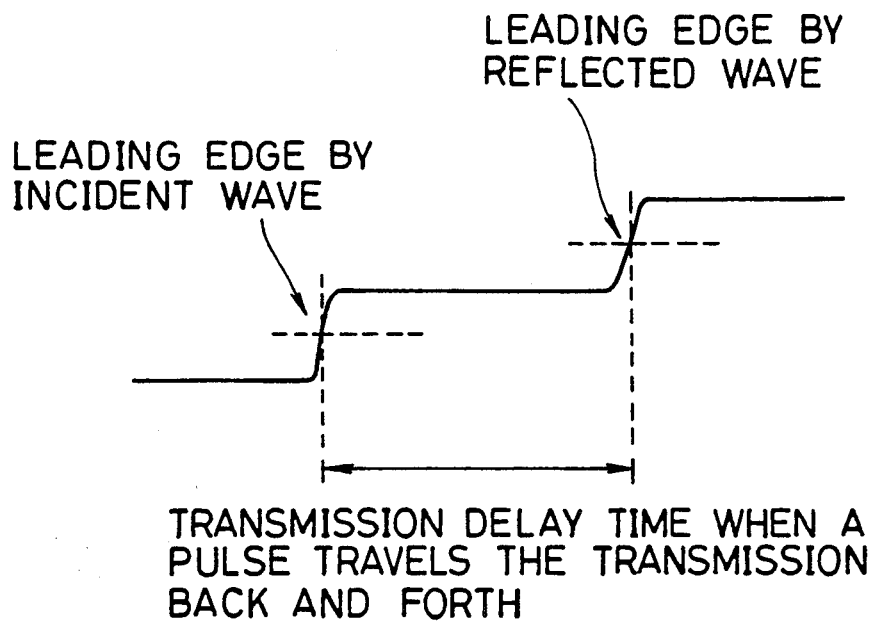
FIG. 1 is an explanatory diagram showing an example of a prior art method of measuring the length of a transmission line.

It is assumed that one end of the transmission line, which is called the far-end, is open, and that pulse signals are supplied from the other end of the transmission line, which is called the near-end. Then, as shown in FIG. 1, stepwise waveforms in which the reflected wave is superposed with the incident wave is observed at the near-end, when the output impedance at the near end is matched with the characteristic impedance of the transmission line. In this embodiment, the transmission delay time of the transmission line is measured in accordance with the following procedure by using the stepwise waveforms.

In the first block 1, as shown in FIG. 3, three elements or parameters, i.e., the time difference T between the leading edge a formed by the incident wave component and the leading edge b formed by the reflected wave, the waveform of the leading edge a formed by the incident wave component and the waveform of the leading edge b formed by the reflected wave component, or alternatively three elements or parameters, i.e., the time difference between the trailing edge formed by the incident wave component and the trailing edge formed by the reflected wave component, the waveform of the trailing edge formed by the incident wave component and the waveform of the trailing edge formed by the reflected wave component.

In the second block 2, a transfer function of the transmission line when a signal propagates through the transmission line in both directions or both ways, i.e., back and forth is computed based on the three elements measured in the first block 1.

In the third block 3, a transfer function of the transmission line when a signal propagates through the transmission line in either direction i.e., either forward or backward, is computed based on the transfer function of the transmission line with respect to the propagation in both directions or in both ways through the transmission line.

In the fourth block 4, an output signal response with respect to an individual input waveform is computed by using the transfer function of the transmission line with respect to the propagation in either direction in the transmission line.

In the fifth block 5, the propagation delay time of the transmission line with respect to the individual input waveform is measured by computing the delay time of the output waveform obtained by the output signal response in the fourth block 4 with respect to the corresponding input waveform.

For example, in the first block 1, by applying a sampling oscilloscope, an apparatus for measuring the length of a transmission line disclosed in Japanese Laid-open Patent Application No. 150877/1989, or an apparatus to be explained later with reference to FIG. 5, three elements or parameters, i.e., the time difference T between the leading edge a formed by the incident wave component and the leading edge b formed by the reflected wave, the waveform of the leading edge a formed by the incident wave component and the waveform of the leading edge b formed by the reflected wave component, or alternatively three elements or parameters, i.e., the time difference between the trailing edge formed by the incident wave component and the trailing edge formed by the reflected wave component, the waveform of the trailing edge formed by the incident wave component and the waveform of the trailing edge formed by the reflected wave component can be measured.

For example, in the second block 2, by measuring the waveform of the edge of the incident wave, a response $vin(t)$ of the input signal in the time domain is obtained. The frequency response $Vin(f)$ of the input signal is obtained from $vin(t)$, for example, by means of Fourier conversion. The frequency response $Vref(f)$ of the reflected wave is obtained from the measurement result of the waveform of the edge of the reflected wave by means of Fourier conversion. Then, the frequency response Hround(f) of the transmission line itself with respect to propagation in both directions in the transmission line is calculated by the following equation:

$$Hround(f) = Vref(f)/Vin(f).$$

Further, as far as the reflected wave traveling forward and backward or in both directions through the transmission line is concerned, its transmission with is equivalent electrically to a path formed by connecting two identical transmission lines in series through which a signal travels in one direction. Therefore, for example, in the third lock 3, the frequency response Honeway(f) of the transmission line connected in series, through which signal travels in one direction, is obtained as the square root of Hround(f).

Accordingly, for example, in the fourth block 4, the frequency response $vout(f)$ of the output signal at the for end of the transmission line after the input signal having a frequency response Vin(f) propagates through the transmission line in one direction is obtained by the following equation:

$$Vout(f) = Honeway(f) \times Vin(f).$$

By the inverse Fourier transform, the response $vout(t)$ of the output signal in the time domain is given by the following equation:

$$vout(t) = F^{-1}[Honeway(f) \times Vin(f)],$$

where $F^{-1}$ is an operator for the inverse Fourier transform.

As a result, for example, in the fifth block 5, by calculating the respective times t1 and t2 of $vout(t)$ and $vin(t)$ at the intermediate level at which the amplitude of the signal is 50% of the full amplitude, end then by obtaining the difference between t1 end t2, the transmission delay time to be measured can be obtained.

Also, with respect to an input signal having characteristics different from those of the input signal to the transmission line in the above described measurement, by calculating the input signal response $vin(t)$, in a manner similar to that of the waveform measurement of the edge of the signal waveform in the first block 1, the transmission delay time with respect to the input signal can be precisely measured by this response.

According to the above mentioned measurement method, the transfer function of the transmission line with respect to the propagation in one direction in the transmission line is measured first and then the transmission delay time can be measured in accordance with the transfer function thus measured and the characteristics of the input signal. Accordingly, this embodiment of the present invention can provide the measured delay time which is closer to an actual operation condition than the delay time measured by the conventional method where the delay time is determined as one half of the time required that a signal travels forward and backward in both directions through the transmission line. The dependence upon the frequency component of the input signal is taken into account in the measured delay time thus obtained in the above method, and hence the transmission delay time of the independent input signal can be measured precisely.

Further, the respective process steps in the above described blocks 2 to 5 can be performed by using a computer.

Next, the second embodiment of the present invention will be described. For example, assuming a connection between 8 conventional test apparatus for an integrated circuit and devices under test, the high frequency component of a signal is attenuated by the time constant component determined by the capacitance of the input terminals of the devices under test or the packages of the devices and the characteristic impedance of the transmission line. This influence is a major factor because the signal waveform obtained from the output terminal of the transmission line is deteriorated with respect to the input signal.

Figure 4:
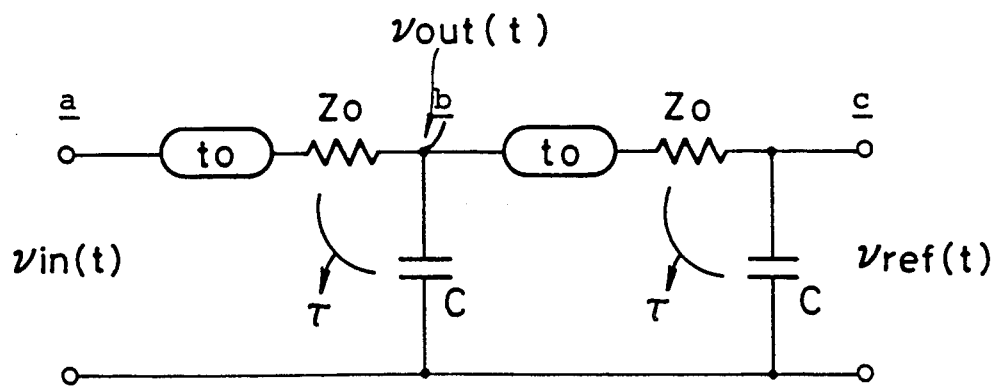
FIG. 4 is a circuit diagram showing a model for explaining one embodiment of a method of calculating a transmission function of a transmission line as one essential feature of the present invention.
Figure 2:
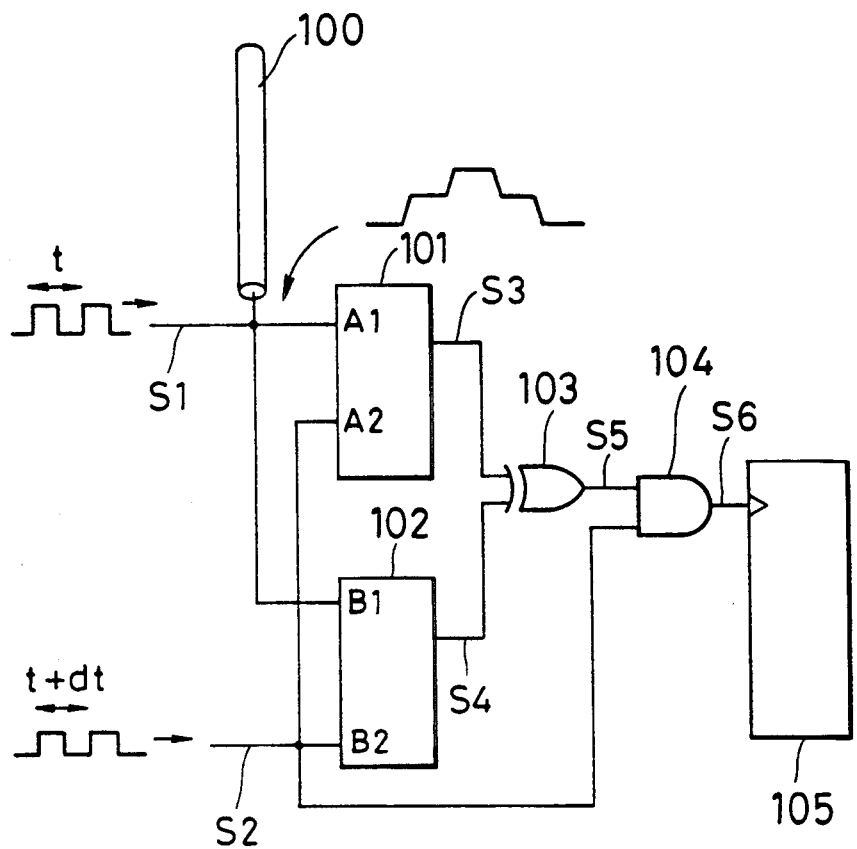
FIG. 2 is a circuit block diagram showing an example of a prior art system.

With this in view, in this embodiment, a model as illustrated in FIG. 4 is assumed, in order to compute the transfer function of the transmission line, which is an essential feature of the present invention. In this model, the transmission line is represented by the transmission delay time $t_0$ in a hypothetial ideal characteristic of the transmission line, the time constant component $\tau$ determined by the capacitance C of the input terminals of the devices under test or packages of the devices, and the characteristic impedance Zo of the transmission line. Furthermore, in order to explain the effects by the incident wave and the reflected wave, the path for the incident wave and the path for the reflected wave are assumed to be independent lines connected in cascade.

According to this model, it is assumed that the input signal, i.e., the incident wave component $vin(t)$ of the stepwise input signal is applied to the input terminal a, end that the output signal $vout(t)$ at the far-end of the transmission line appears at the midpoint b, end the reflected wave component $vref(t)$ appears at the output terminal c.

According to this model, the transmission line is simplified only by the delay time $t_0$ end the time constant component $\tau$. As a result, the transfer functions of the one way path and the two way path of the transmission line can be obtained simply by the Laplace Transform and Inverse Laplace Transform, so that the transmission delay time can be measured by a process similar to that employed in connection with the first embodiment.

Also, utilizing this embodiment, like the first embodiment, the present invention can provide a measured delay time which is closer to an actual operation condition than the delay time measured by the conventional method where the delay time is determined as one-half of the time required for a signal $t_0$ to travel forward and backward in both the directions through the transmission line. The dependence upon the frequency component of the input signal is regarded in the measured delay time thus obtained in the above method and hence, the transmission delay time of the independent input signal can be measured precisely.

As is apparent from the above description, according to the present invention, by measuring the waveform of the reflected wave obtained by transmitting a pulse to the open-ended transmission line, a transfer function of the transmission line with respect to the incident wave is computed as a result of the measurement. Then, the waveform of the output wave at the output end or the open end of the transmission line is estimated in response to an individual input signal by using the transfer function computed. The transmission delay time of the transmission line is obtained by computing the time difference between the transient timing of the estimated waveform of the output wave and the transient timing of the waveform of the input signal. As a result, according to the present invention, the length of the transmission line can be measured precisely despite an increase in the delay time due to a deteriorated waveform of the traveling wave in the transmission line which is caused by the inherent frequency response of the transmission line and the frequency spectrum of the input signal.

Figure 5:
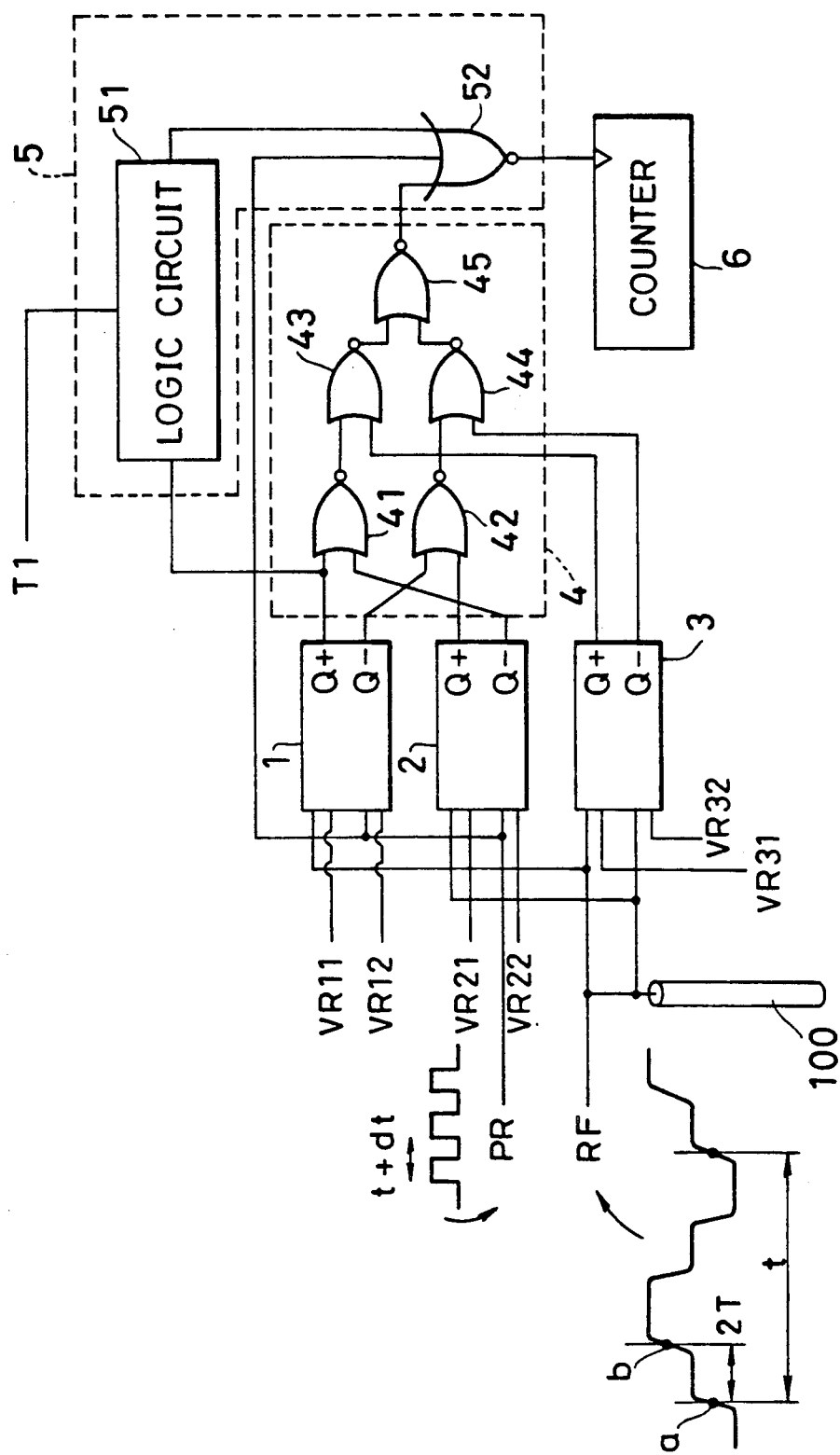
FIG. 5 is a circuit block diagram showing one embodiment of a basic circuit arrangement of an apparatus for measuring the length of a transmission line in with the present invention.
Figure 6:
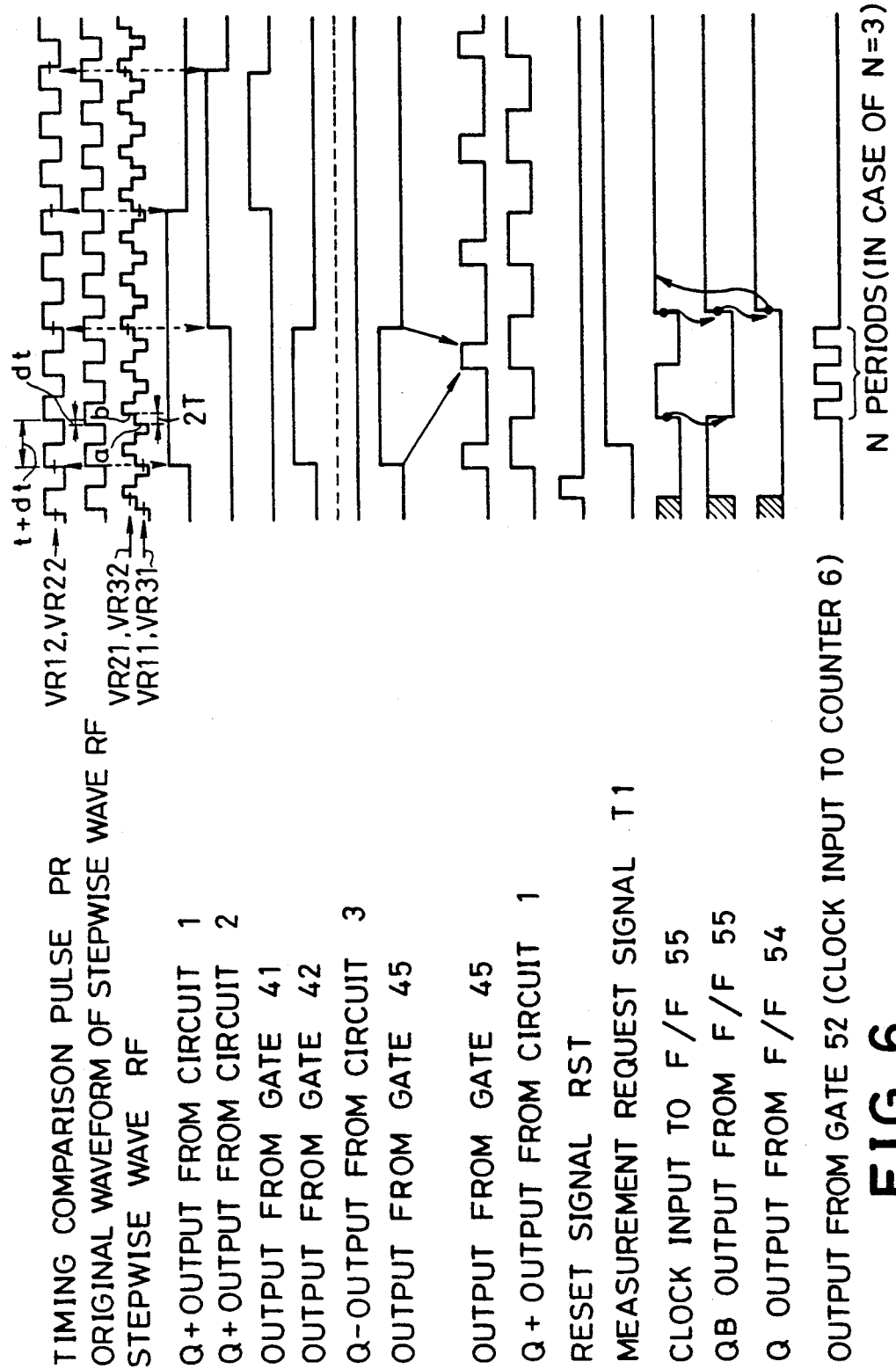
FIG. 6 is a time chart showing a operation principle of an apparatus for measuring the length of a transmission line in accordance with the present invention; end

FIG. 5 shows one embodiment of a fundamental circuit arrangement of a measurement apparatus in accordance with the present invention. FIG. 6 illustrates a time chart of signals at various positions of the embodiment of the fundamental circuit arrangement of a measurement apparatus in accordance with the present invention shown in FIG. 5. This embodiment will be explained with reference to FIGS. 5 and 6.

In a stepwise waveform RF obtained by opening the far-end of a transmission line 100 having a delay time T, the first edge formed by the incident wave is designated as a and the second edge formed by the reflected wave is designated as b The time difference between the edges a and b is 2T.

In FIG. 5, reference numerals 1, 2 and 3 denote phase difference detecting circuits having control of both threshold values with respect to the respective input signals. A stepwise waveform signal RF and a timing comparison pulse PR are supplied to the phase difference detecting circuit 1 as input signals to be measured to compare the phase difference between the leading edge a formed by the incident wave and the leading edge of the timing comparison pulse PR. In the phase difference detecting circuit 1, as shown in FIG. 6, an intermediate level of the leading edge formed by the incident wave and an intermediate level of the timing comparison pulse PR are set as reference level inputs VR11 and VR12 for determining the input signal threshold values, respectively.

The signals RF and PR are supplied to the phase difference detecting circuit 2 as input signals to be measured to compare the phase difference between the leading edge b formed by the reflected wave and the leading edge of the timing comparison pulse PR. In the phase difference detecting circuit 2, as shown in FIG. 6, an intermediate level of the leading edge b formed by the reflected wave and an intermediate level of the timing comparison pulse PR are set as reference level inputs VR21 and VR22 for determining the input signal threshold values, respectively.

The signal RF is supplied to the phase difference detecting circuit 3 as a common input signal to be measured to compare the phase difference between the leading edge a of the incident wave and the leading edge b of the reflected wave. In the phase difference detecting circuit 3, as shown in FIG. 6, an intermediate level of the leading edge a of the incident wave and an intermediate level of the leading edge b of the reflected wave are set as reference level inputs VR31 and VR32 for determining the input signal threshold values, respectively.

As shown in FIG. 6, the phase difference detecting circuits 1 and 2 output the phase difference information signal Q+ and its inverted signal Q− of NRZ(Non Return Zero) which have a high level value representing positive phase difference information when the timing of the timing comparison pulse PR is delayed relative to the other timing and a low level value representing negative phase difference information when the timing of the timing comparison pulse PR is leading relative to the other timing.

On the other hand, the operation of the phase difference detecting circuit 3 is similar to that of the phase difference detecting circuit 1 or 2. Since the timing of the leading edge of the reflected wave is delayed relative to the timing of the leading edge of the incident wave, Q+ always outputs a high level NRZ signal as positive phase difference information, and Q− always outputs a low level NRZ signal as negative phase difference information.

Here, it is assumed that the repetition period of the stepwise wave RF is t and that the repetition period of the timing comparison pulse PR is t+dt. Since the difference between these repetition periods of both the signals RF and PR is dt, the phase shift between these signals RF and PR increases by dt for every period. Therefore, the periods of the output signals Q+ and Q− from the respective phase difference detecting circuits 1 and 2 are equal to the extended length of (t+dt)/dt times of t+dt. Also, the phase shift between the output signals Q+ and Q−from the phase difference detecting circuit 1 and the output signals Q+ and Q− from the phase difference detecting circuit 2 is equal to the extended length of (t+dt)/dt times of the time difference 2T between the leading edge a of reflected wave.

Reference numeral 4 denotes a phase difference signal extracting circuit. As an embodiment of the phase difference signal extracting circuit 4, in FIG. 5, the circuit 4 is composed of NOR gates 41, 42, 43, 44 and 45. In the following, the arrangement and the operation of the phase difference signal extracting circuit 4 will be described.

The logic gates 41 and 42 compute NOR logic values between the output signal Q+ from the phase difference detecting circuit 1 and the output signal Q− from the phase difference detecting circuit 2, and between the output signal Q− from the phase difference detecting circuit 1 and the output signal Q+ from the phase difference detecting circuit 2, respectively. The logic gate 41 outputs a high level value only during the time period that there occurs a timing difference between the trailing edge of the output signal Q+ from the phase difference detecting circuit 1 and the trailing edge of the output signal Q+ from the phase difference detecting circuit 2, as shown in FIG. 6. The logic gate 42 outputs a high level value only during the time period that there occurs a timing difference between the leading edge of the output signal Q+ from the phase difference detecting circuit 1 and the leading edge of the output signal Q+ from the phase difference detecting circuit 2, as shown in FIG. 6.

Furthermore, when NOR logic values between the output signal from the logic gate 41 and the output signal Q+ from the phase difference detecting circuit 3, and between the output signal from the logic gate 42 and the output signal Q-from the phase difference detecting circuit 3 are obtained by the logic gates 43 and 44, respectively, the output signal Q+ from the circuit 3 is always maintained at a high level, so that the output signal from the logic gate 43 is always fixed at a low level. On the other hand, the output signal Q− from the circuit 3 is always fixed at a low level as shown in FIG. 6, so that the output signal from the logic gate 44 is equal Lo an inverted signal of the output signal from the logic gate 42. That is, a low level occurs only during the time period that there occurs a timing difference between the leading edge of the output signal Q+ from the phase difference detecting circuit 1 and the leading edge of the output signal Q+ from the phase difference detecting circuit 2. As a result, this time period can be extracted by the phase difference signal extracting circuit 4. Accordingly, when NOR logic value between the output signals from the logic gate 43 and the logic gate 44 is obtained by the logic gate 45, as shown in FIG. 6, only the time period that there occurs a timing difference between the leading edge of the output signal Q+ from the phase difference detecting circuit 1 and the leading edge of the output signal Q+ from the phase difference detecting circuit 2 can be extracted by the logic gate 45.

Further, if the connections of the output signals Q+ and Q− from the phase difference detecting circuit 3 are reversed with respect to each other, the output of the logic gate 45 produces a low level only during the time period that there occurs a timing difference between the trailing edge of the output signal Q+ from the phase difference detecting circuit 1 and the trailing edge of the output signal Q+ from the phase difference detecting circuit 2, so that this time period can be extracted. Therefore, even if there is a difference between the detecting sensitivity between the leading edges and the detecting sensitivity between the leading edge and the trailing edge with respect to the detecting characteristics of the phase difference detecting circuits 1 and only information on the side of a higher detection sensitivity can extracted in accordance with the selection of a mode of connection of the output signals Q+ and Q− from the phase difference detecting circuit 3. As result, a highly accurate phase difference detection can be realized.

Figure 7:
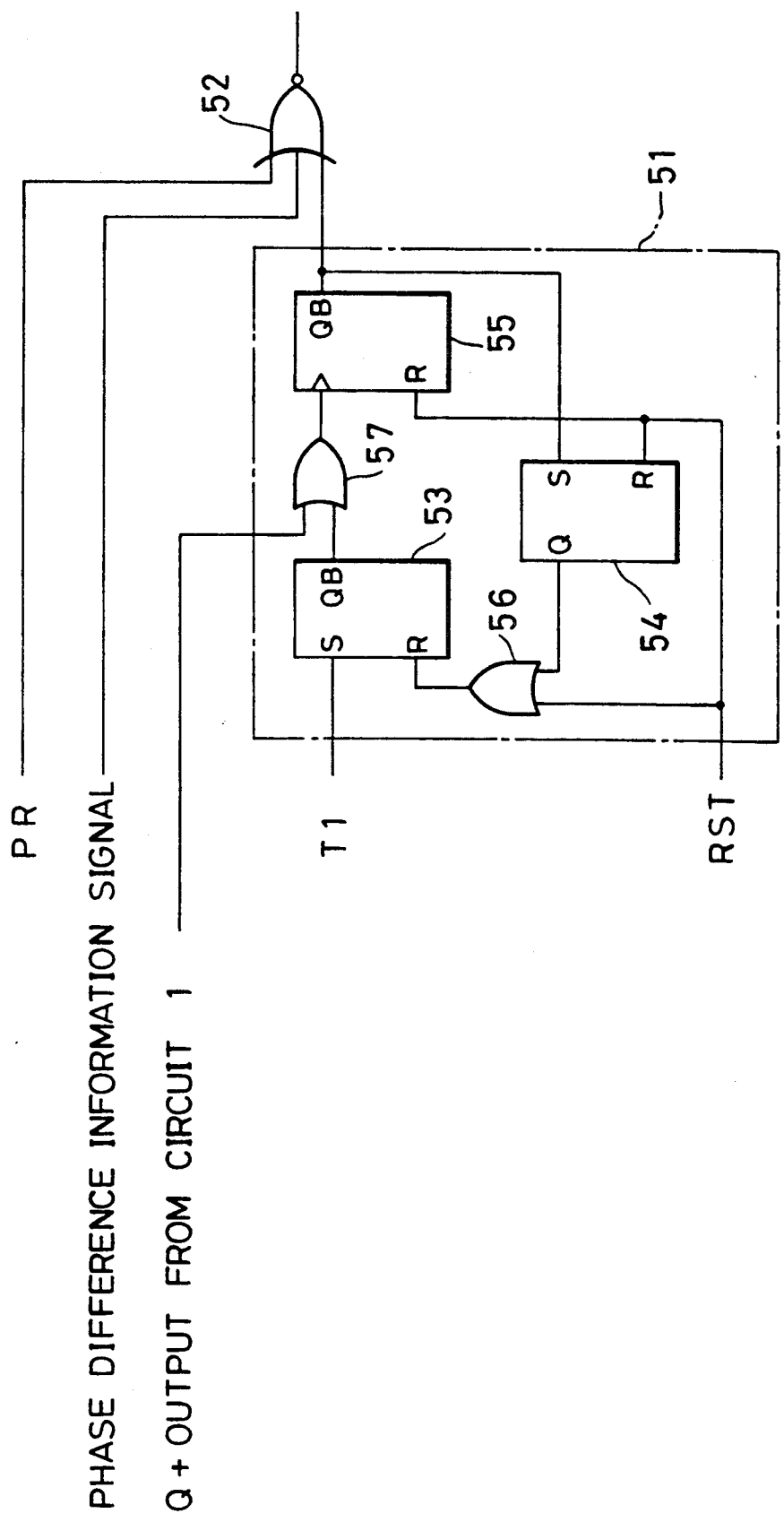
FIG. 7 is a circuit block diagram showing one embodiment of a circuit arrangement applicable to a reference pulse gate circuit in the present invention.

Reference numeral 5 denotes a reference pulse gate circuit, which is composed of a logic circuit 51 as shown in FIG. 7 and an NOR gate 52. The arrangement and the operation of this reference pulse gate circuit will be described in the following with using an embodiment shown in FIG. 7.

The reference pulse gate circuit 5 has the NOR gate 52 and the logic circuit 51 having set-reset flip-flops 53 and 54 in which reset has priority, toggle flip-flop 55 with forced reset and OR logic gates 56 and 57.

In this circuit, it is assumed that each of the flip-flops 53, 54 and 55 establishes its output signals Q and QB by sensing the leading edge of a clock input. In the first step, as shown in FIG. 7, the flip-flops 53, 54 and 55 are initialized by a reset signal RST.

When measurement trigger signal T1 is rendered to a high level, the output signal QB of the flip-flop 53 receiving the signal T1 is rendered to low level. As shown in FIG. 7, this output signal QB and the output signal Q+ from the phase difference detecting circuit 1 are applied to the clock input of the toggle flip-flop 55 via the OR gate 57. The output signal QB from the toggle flip-flop 55 is inverted by the leading edge of the output signal Q+ from the phase difference detecting circuit 1, so that the output signal QB from the toggle flip-flop 55 is inverted again to a high level by the second leading edge of the output signal Q+ from the phase difference detecting circuit 1. This output signal QB is supplied to the set terminal of the flip-flop 54 and the output signal Q from the flip-flop 54 is inverted to a high level. This output signal Q and the reset signal RST are supplied to the reset terminal of the flip-flop 53 through the OR gate 56. As a result, the flip flop 53 is reset, so that the clock input to the toggle flip flop 55 is thereafter prohibited.

In this manner, just after the measurement trigger signal T1 is applied to the flip-flop 53 an output signal QB from the toggle flip-flop 55 is rendered to a high level only during one period of the output signal Q+ from the phase difference detecting circuit 1 just after the measurement trigger signal T1 is applied to the flip-flop 53. The output signal from the NOR gate 52 is as shown in FIG. 6 when the output signal QB, the timing comparison pulse PR and the output signal from the NOR gate 45 are supplied to the NOR gate 52.

The phase difference information signal extracted in the phase difference signal extraction circuit 4 is repeatedly generated at a signal period given by the output signals Q+ or Q− from the phase difference detecting circuits 1 and 2 as long as the stepwise wave signal RF and the timing comparison pulse PR are inputted to the phase difference detecting circuits 1, 2 and 3.

Accordingly, for example, in the reference pulse gate circuit 5 as shown in FIG. 7, after the external measurement trigger signal T1 is applied to the circuit 5, a signal portion corresponding to one period or cycle of the output signal Q+ from the phase difference detecting circuit 1 is extracted by the logic circuit 51. The NOR gate 52 produces an NOR output of the output signal thus extracted, the phase difference information signal from the phase difference signal extraction circuit 4 and the timing comparison pulse PR. Then, a series of pulses of the timing comparison pulse PR to be transmitted during one cycle period of a period during which there occurs a timing difference between the leading edge of the output signal Q+ from the phase difference detecting circuit 1 and the leading edge of the output signal Q+ from the phase difference detecting circuit 2.

Therefore, if the number of output pulses from the logic gate 52 counted by the counter 6 is N, the period of time during which there occurs a timing difference between the leading edge of the output signal Q+ from the phase difference detecting circuit 1 and the leading edge of the output signal Q+ from the phase difference detecting circuit 2 can be recognized as N times the cyclic period (t+dt) of the timing comparison pulse PR.

As described earlier, since the phase relationship between the output signals Q+ and Q− from the phase difference detecting circuit 1 and the output signals Q+ and Q− from the phase difference detecting circuit 2 is equal to an extended period of time corresponding to (t+dt)/dt times the time difference 2T between the leading edge a of the incident wave and the leading edge b of the reflected wave, the following equation can be obtained:

$$2T \times (t+dt)/dt = N \times (t+dt).$$

With this equation, a value to be measured, i.e., the length of the transmission line T can be derived from the measured value N and the difference dt in the period between the measured value N and the reference input signal, as follows:

$$T = N \times dt/2.$$

Now, by using the measurement apparatus shown in FIG. 5, one embodiment of measuring the three parameters described above with referring to FIG. 3 will be explained.

At first, the stepwise wave RF formed by reflection is supplied to the phase difference detecting circuits 1, 2 and 3. The timing comparison pulse PR is supplied to the phase difference detecting circuits 1 and 2, and the NOR gate 52.

Next, the threshold value VR12 for the input signal to the phase difference detecting circuit 1 and the threshold value VR22 for the input signal to the phase difference detecting circuit 2 are set at an intermediate level of the timing comparison pulse PR. The threshold value VP11 for the input signal to the phase difference detecting circuit 1 and the threshold value VR31 for the input signal to the phase difference detecting circuit 3 are set at an intermediate level of the leading edge formed by the incident wave component of the stepwise wave RF. The threshold value VR21 for the input signal to the phase difference detecting circuit 2 and the threshold value VR32 for the input signal to the phase difference detecting circuit 3 are set at an intermediate level of the leading edge formed by the reflected wave component of the stepwise wave RF. These threshold values are used as initial conditions. Under these initial conditions, by measuring the length of the transmission line, the first parameter, i.e., a transmission delay time between the intermediate level of the leading edge formed by the incident wave component and the intermediate level of the leading edge formed by the reflected wave component can be measured. Next, in accordance with the initial conditions, by repeating the measurement of the length of the transmission line while sweeping gradually only the threshold value VR11 for the input signal to the phase difference detecting circuit 1 within a range of the amplitude of the leading edge formed by the incident wave component of the stepwise wave RF, the time response of the leading edge formed by the incident wave component, that is, the second parameter representing the waveform of this leading edge can be measured. Furthermore, in accordance with the initial conditions, by repeating the measurement of the length of the transmission line while sweeping gradually only the threshold value VR21 for the input value to the phase difference detecting circuit 2 within a range of the amplitude of the leading edge formed by the reflected wave component of the stepwise wave RF, the time response of the leading edge formed by the reflected wave component, that is, the third parameter representing the waveform of this edge can be measured. In this manner, all three parameters can be measured.

While in the above explanation, one embodiment of the present invention was shown in the case of measuring the length T of the transmission line, through which the stepwise wave RF propagates, by measuring the time interval between the leading edge a formed by the incident wave and the leading edge b formed by the reflected wave of the stepwise wave RF, the length T of the transmission line can also be obtained by measuring the time interval between the trailing edge a formed by the incident wave and the trailing edge b formed by the reflected wave of the stepwise wave RF. In the latter case, by using a circuit for comparing the phase difference between the trailing edges of the input signals as phase difference detecting circuits 1, 2 and 3, the length T of the transmission line can be obtained by the same procedure as that of the former case.

Alternatively, as the phase difference detecting circuits 1, 2 and 3, a circuit which can be controlled to select the phase difference comparison between the trailing edges of the input signals or the phase difference comparison between the leading edges of the input signals can be used.

As factors governing measurement accuracy, there are the stability of the repetition period of the inputted stepwise wave RF and the timing pulse signal PR and the detecting sensitivity of the above mentioned phase difference detecting circuits 1, 2 and 3, as for the former factor, i.e., the frequency stability of RF, if a commercially available waveform synthesizer is used as a signal generator having a frequency resolution of 1 Hz and a frequency stability of $1 \times 10^{-11}$/min, for example, the frequency stability of RF can be attained to be 0.8 ps±0.0004 ps, if the repetition frequency is set to be 50 MHz±1 Hz (50000000±1 Hz) and 50.002000 MHz±1 Hz(50002000±1 Hz). As for the latter factor, i.e., the detecting sensitivity of the detecting circuits, as described above, for example, by applying a circuit disclosed in Japanese Laid-open Patent Application No. 233382/1988 to the phase difference detecting circuits, such a detecting sensitivity as a few pico seconds can be attained by using conventional semiconductor technologies. Thus, according to the present invention, the length of the transmission line can be measured with both the measurement resolution and the detecting sensitivity of the order of pico seconds.

As is apparent from the above explanation, according to the present invention, even if the detecting sensitivities of the phase difference detecting circuits are different between the edges with an identical polarity and the edges with different polarities, the characteristics of the phase difference detecting circuits can be used most effectively and hence the length of the transmission line can be measured precisely. In addition, according to the present invention, without controlling the number of pulses in the input signal, it is ensured that the number of pulses corresponding to the length of the transmission line can be obtained.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A method of measuring the length of a transmission line having a near-end and an open-ended far-end, said length being measured by applying a pulse to said near-end and obtaining a reflected wave from said far-end, comprising a first step of measuring three elements including
a time difference between a pulse edge formed by an incident wave component of said pulse and a pulse edge formed by a reflected wave component of said pulse,
a waveform of said pulse edge formed by said incident wave component, and
a waveform of said pulse edge formed by said reflected wave component;

a second step of computing a first transfer function of said transmission line when said pulse travels from said near-end to said far-end thereof and is reflected back to said near-end, said first transfer function being computed from the measurements made in said first step;

a third step of computing a second transfer function of said transmission line when said pulse travels after from said near-end to said far-end or from said far-end to said near-end thereof, said second transfer function being computed in accordance with said first transfer function;

a fourth step of computing an output signal response with respect to an individual input signal from said second transfer function when said pulse travels either from said near-end to said far-end or from said far-end to said near-end of said transmission line; and a fifth step of computing a delay time of said output signal response with respect to said input signal in accordance with said output signal response, whereby a transmission delay time of said transmission line with respect to said individual input signal is measured.

2. A method of measuring the length of a transmission line as claimed in claim 1, further comprising:

a sixth step of separating said transmission delay time into a true transmission delay time defined by an ideal condition having an infinite frequency band and an additional transmission delay time due to an actual condition deviated from said ideal condition;

a seventh step of representing a single path in either direction of said transmission line as a circuit for defining said true transmission delay time to be a constant value, and defining said additional transmission delay time to be a time constant component given by a product of a characteristic impedance and a capacitance component of said transmission line;

an eighth step of representing a two way path in both directions of said transmission line by a series circuit connection of two single paths, each of said paths being directed in either direction of said transmission line; and a ninth step of approximating said transfer functions of said transmission line by a transfer function given by the circuit representations.

3. A method of measuring the length of a transmission line as claimed in claim 1, wherein said first transfer function is obtained from Fourier transforms of the incident and reflected wave components of said pulse; and said output signal response is obtained from the inverse Fourier transform of the product of said second transfer function and the Fourier transform of said incident wave component.

4. A method of measuring the length of a transmission line as claimed in claim 3, further comprising:

a sixth step of separating said transmission delay time into a true transmission delay time defined by an ideal condition having an infinite frequency band and an additional transmission delay time due to an actual condition deviated from said ideal condition;

a seventh step of representing a single path in either direction of said transmission line as a circuit for defining said true transmission delay time to be a constant value; and defining said additional transmission delay time to be a time constant component given by a product of a characteristic impedance and a capacitance component of said transmission line;

an eighth step of representing a two way path in both directions of said transmission line by a series circuit connection of two single paths, each of said paths being directed in either direction of said transmission line; and a ninth step of approximating said transfer functions of said transmission line by a transfer function given by the circuit representations.

5. A method of measuring the length of a transmission line as claimed in claim 3 wherein said first transfer function is obtained as a function of frequency by dividing the Fourier transform of the reflected wave component by the Fourier transform of the incident wave component of said pulse; and said second transform function is obtained by extracting the square root of said first transfer function.

6. An apparatus for measuring the length of a transmission line having a near-end and an open-ended far-end, said length being measured by applying a pulse to said near-end and obtaining a reflected wave from said far-end, comprising:

a first phase difference detecting circuit receiving as input signals a stepwise wave generated by an open end part of said transmission line as a result of said applied pulse and having a constant repetition period and a reference pulse signal having a repetition period which is incrementally different from the repetition period of said stepwise wave, threshold values of said input signals being controllable independently, said first phase difference detecting circuit detecting selectively a phase shift between both input signals at every leading or trailing edge of said stepwise wave formed by an incident wave component obtained when said pulse travels from the near-end to the far-end of said transmission line a second phase difference detecting circuit receiving as input signals said stepwise wave and said reference pulse signal, threshold values of said input signals being controllable independently, said second phase difference detecting circuit detecting selectively a phase difference between both input signals at every leading or trailing edge of said stepwise wave formed by a reflected wave component obtained when said pulse travels from the far-end to the near-end of said transmission line;

a third phase difference detecting circuit receiving as two common input signals said stepwise wave, threshold values of said input signals being controllable independently, said third phase difference detecting circuit detecting selectively a phase difference between a leading edge of a reflected wave component of said stepwise wave and a leading edge of an incident wave component of said stepwise wave or a phase difference between a trailing edge of said reflected wave component of said stepwise wave and a trailing edge of said incident wave component of said stepwise wave;

a phase difference signal extraction circuit receiving a first phase difference information signal from said first phase difference detecting circuit, a second phase difference information signal from said second phase difference detecting circuit and a third phase difference information signal from said third phase difference detecting circuit, said phase difference signal extraction circuit extracting selectively one of a phase shift period between a leading edge part of said first phase difference information signal and a leading edge part of said second phase difference information signal and a phase shift period between a trailing edge part of said first phase difference information signal and a trailing edge part of said second phase difference information signal;

a reference pulse gate circuit receiving a request signal, for enabling said reference pulse signal only during said phase shift period extracted by said phase difference signal extraction circuit and a period of time corresponding to one period of said first or said second phase difference information signal after said request signal is inputted; and a counter for counting an output signal from said reference pulse gate circuit.

* * * * *